(12) United States Patent
Sabuncuoglu Tezcan et al.

(10) Patent No.: US 12,017,909 B2
(45) Date of Patent: Jun. 25, 2024

(54) FABRICATION METHOD FOR A MEMS DEVICE

(71) Applicant: IMEC VZW, Leuven (BE)

(72) Inventors: Deniz Sabuncuoglu Tezcan, Leuven (BE); Antonia Malainou, Leuven (BE)

(73) Assignee: Imec vzw, Leuven (BE)

( * ) Notice: Subject to any disclaimer, the term of this patent is extended or adjusted under 35 U.S.C. 154(b) by 155 days.

(21) Appl. No.: 16/895,523

(22) Filed: Jun. 8, 2020

(65) Prior Publication Data

US 2021/0061652 A1 Mar. 4, 2021

(30) Foreign Application Priority Data

Aug. 30, 2019 (EP) .................................. 19194601.1

(51) Int. Cl.
*B81C 1/00* (2006.01)
(52) U.S. Cl.
CPC ...... *B81C 1/00238* (2013.01); *B81C 1/00269* (2013.01); *B81C 1/00325* (2013.01); *B81B 2207/015* (2013.01); *B81C 1/00301* (2013.01)
(58) Field of Classification Search
CPC ............ B81C 1/00238; B81C 1/00269; B81C 1/00325; B81C 1/00301; B81C 2203/0792; B81B 2207/015
See application file for complete search history.

(56) References Cited

U.S. PATENT DOCUMENTS 9,630,834 B2 4/2017 Tayebi et al.
9,975,763 B2 5/2018 Shin et al.
(Continued)

FOREIGN PATENT DOCUMENTS

WO 2018054470 A1 3/2018
WO WO-2019225047 A1 * 11/2019 ......... B81C 1/00325

OTHER PUBLICATIONS

European Search Report, EP Application No. 19194601.1, mailed Mar. 17, 2020, 7 pages.
(Continued)

*Primary Examiner* — Shahed Ahmed
*Assistant Examiner* — Sun Mi Kim King
(74) *Attorney, Agent, or Firm* — McDonnell Boehnen Hulbret & Berghoff LLP (57) ABSTRACT

A Microelectromechanical Systems (MEMS) device combining a MEMS layer and a Complementary Metal-Oxide-Semiconductor (CMOS) Integrated Circuit (IC), and its fabrication method is provided. The fabrication method includes: processing the MEMS layer on a first semiconductor substrate, the MEMS layer including one or more movable structures and one or more anchor structures; processing one or more first contacts on the first semiconductor substrate, each first contact being processed into one of the anchor structures and being configured to bias that anchor structure; processing the CMOS IC on a second semiconductor substrate; processing one or more second contacts on the second semiconductor substrate, each second contact being connected to the CMOS IC; and bonding the first semiconductor substrate to the second semiconductor substrate such that each first contact directly contacts one of the second contacts. The method can allow fabricating the MEMS device without vapor HF etching. The method can further enable zero level packaging, fusion bonding, a C-SOI approach, and high-vacuum sealing. An integrated zero level hermetic packaging MEMS device can be realized based on fusion bonding of moisture resistant materials. Further, Cu/dielectric bonding and electrical connections to individual parts of the MEMS device are allowed, in order to apply isolated voltages.

14 Claims, 10 Drawing Sheets

(56) References Cited

U.S. PATENT DOCUMENTS

| | | |
|---|---|---|
| 10,160,640 B2 | 12/2018 | Cheng et al. |
| 10,196,261 B2 | 2/2019 | Rothberg et al. |
| 10,242,967 B2 | 3/2019 | Drab et al. |
| 2012/0313235 A1* | 12/2012 | Chu ............... B81B 3/001 |
| | | 257/692 |
| 2013/0277777 A1* | 10/2013 | Chang ............ B81C 1/00325 |
| | | 438/51 |
| 2015/0232329 A1 | 8/2015 | Classen |
| 2016/0297673 A1 | 10/2016 | Lagouge et al. |
| 2017/0008757 A1 | 1/2017 | Cheng et al. |
| 2017/0313581 A1 | 11/2017 | Cheng et al. |

OTHER PUBLICATIONS

Wan, Zhe, Kevin Winstel, Arvind Kumar, and Subramanian S. Iyer. "Low-Temperature Wafer Bonding for Three-Dimensional Wafer-Scale Integration." In 2018 IEEE SOI-3D-Subthreshold Microelectronics Technology Unified Conference (S3S), pp. 1-2. IEEE, 2018.

Cheng, Shyh-Wei, Jui-Chun Weng, Kai-Chih Liang, Yi-Chiang Sun, and Weileun Fang. "Realize multiple hermetic chamber pressures for system-on-chip process by using the capping wafer with diverse cavity depths." Journal of Micromechanics and Microengineering 28, No. 4 (2018): 045005.

Wen, Haoran, Anosh Daruwalla, Yaesuk Jeong, Pranav Gupta, Jaehoo Choi, Chang-Shun Liu, and Farrokh Ayazi. "Wafer-level-packaged HARPSS+ MEMS platform: Integration of robust timing and inertial measurement units (TIMU) on a single chip." In 2018 IEEE/ION Position, Location and Navigation Symposium (PLANS), pp. 261-266. IEEE, 2018.

Liu, Cong, Joerg Froemel, Jianlin Chen, Takashiro Tsukamoto, and Shuji Tanaka. "Laterally vibrating MEMS resonant vacuum sensor based on cavity-SOI process for evaluation of wide range of sealed cavity pressure." Microsystem Technologies 25, No. 2 (2018): 487-497.

European Office Action, Application No. EP 19194601.1, dated May 30, 2023, 6 pages.

* cited by examiner

FABRICATION METHOD FOR A MEMS DEVICE

CROSS-REFERENCE

This application claims priority from European Patent Application no. 19194601.1, filed Aug. 30, 2019, which is incorporated by reference in its entirety.

TECHNICAL FIELD

The present disclosure relates to the field of Microelectromechanical Systems (MEMS) devices. In particular, the disclosure relates to MEMS devices combining a MEMS layer and a Complementary Metal-Oxide-Semiconductor (CMOS) Integrated Circuit (IC). The disclosure presents a method for fabricating such a MEMS device, and presents the MEMS device itself.

BACKGROUND OF THE DISCLOSURE

MEMS devices result from the integration of mechanical elements (which typically include one or more movable structures), sensors, actuators, and/or electronics on a semiconductor substrate or a single chip. The integration is done by utilizing microfabrication technology. Due to the benefits brought by this integration, MEMS devices promise to revolutionize many product categories.

One way of designing a MEMS device, such that the mechanical elements (included in a MEMS layer of the MEMS device) can be electrically controlled, is to combine the MEMS layer with a CMOS IC. The CMOS IC can, in particular, be used to drive the movable structures in the MEMS layer and/or to read out a movement or a change of movement of the movable structures in the MEMS layer.

Conventionally, such MEMS devices are fabricated by using vapor HF etching, or difficult to control sacrificial layer removals. HF vapor etching has distinct limitations in the MEMS device fabrication process. In particular, vapor HF is fairly aggressive and can easily penetrate common passivation layers. Further, commonly used masking layers are made of Low Pressure Chemical Vapor Deposition (LPCVD) silicon nitride. The LPCVD silicon nitride decomposes quickly into a whitish powder when exposed to vapor HF. Also, most other conventional masking layers are not well compatible with vapor HF etching. Thus, when using vapor HF, the fabrication process are usually designed in such a way that the MEMS device does not require any protective hard masks during its production. Furthermore, also many other materials used in the fabrication process of a MEMS device, may not be compatible with vapor HF etching.

In summary, the conventional fabrication process for a MEMS device has several disadvantages.

SUMMARY OF THE DISCLOSURE

In view of the above-mentioned disadvantages, embodiments of the present disclosure aim to provide an improved method for fabricating a MEMS device. In particular, a method for fabricating a MEMS device that combines a MEMS layer and a CMOS IC. An objective is thereby to provide a fabrication method that does not require vapor HF etching. Furthermore, the method should allow for fabricating a MEMS device with zero level packaging and high vacuum sealing. Thus, obtaining an integrated zero level hermetically packaged MEMS device should be possible. In addition, the fabrication method should yield a MEMS device that can be controlled precisely; in particular, by allowing isolated voltages to be applied to the MEMS layer using the CMOS IC.

The objective is achieved by the embodiments provided in the enclosed independent claims. Beneficial embodiments are also defined in the dependent claims.

A first aspect of the disclosure relates to a method for fabricating a MEMS device, wherein the method comprises processing a MEMS layer on a first semiconductor substrate; the MEMS layer including one or more movable structures and one or more anchor structures; processing one or more first contacts on the first semiconductor substrate; each first contact being processed into one of the anchor structures and being configured to bias that anchor structure; processing a CMOS IC on a second semiconductor substrate; processing one or more second contacts on the second semiconductor substrate, each second contact being connected to the CMOS IC; and bonding the first semiconductor substrate to the second semiconductor substrate such that each first contact directly contacts one of the second contacts.

The method of the first aspect improves the fabrication of a MEMS device. In particular, the fabrication method requires no vapor HF etching, thus it overcomes the above described disadvantages.

The first contacts, provided in the anchor structures (which are immovable structure in the MEMS layer that anchor the movement of the movable structures) may, on the one hand, serve as alignment during the bonding, i.e. they can be aligned to the second contacts. On the other hand, the first contacts allow individually biasing the one or more anchor structures in the MEMS layer, and thus potentially each individual island of multiple islands in the MEMS layer (each island including movable structures and anchor structures). Notably, the MEMS layer provides the MEMS functionality to the MEMS device, i.e. it is where movable structures are driven to move, and where sensing of movements or changes of movements are sensed. The anchor structures can be independently biased with different voltages if needed. The biasing voltages can be controlled via the CMOS IC. Thus, the method yields a MEMS device that can be controlled precisely; in particular, by allowing isolated voltages to be applied by using the CMOS IC.

A low temperature fusion bonding may be used for the bonding step between the first semiconductor substrate and the second semiconductor substrate. One or more layers with moisture blocking capability may be used in the bonding interface. In this way, zero level packaging of the MEMS device can be achieved. Further, the bonding step can be performed within the CMOS thermal budget, and outgassing can be minimized.

In an embodiment of the method, the first contacts are processed to be arranged on a bonding surface of the first semiconductor substrate, and the second contacts are processed to be arranged on a bonding surface of the second semiconductor substrate.

Thus, a direct contact is made between the first contacts and the second contacts during the aligned bonding of the respective bonding surfaces.

In an embodiment of the method, the first contacts are processed into an oxide surface layer of the first semiconductor substrate.

In an embodiment of the method, the second contacts are processed into a silicon carbide, silicon carbide nitride, silicon nitride, silicon oxynitride, or silicon oxide surface layer of the second semiconductor substrate.

Accordingly, the method may use thermal oxides, silicon carbide, silicon carbide nitride, silicon nitride, silicon oxynitride, or silicon oxide. These materials may form the bonding surface of the second semiconductor substrate. This bonding surface may be bonded to the oxide surface layer or a silicon carbide, silicon carbide nitride, silicon nitride, silicon oxynitride, which forms the bonding surface of the first semiconductor substrate. A particularly reliable bonding can be achieved in this way. Further, the outgassing during bonding can be minimized.

In an embodiment of the method, processing the MEMS layer, before the bonding, further includes processing a plurality of cavities surrounding the anchor structures and processing the movable structures, wherein each movable structure is arranged in at least one of the cavities, and each first contact is arranged outside the cavities and/or inside the anchor structures.

A common characteristic of the MEMS device is that the anchor structures and the first contacts are not inside the cavities. The cavities allow the movable structures to move freely, and furthermore support a zero-level hermetic packaging of the MEMS device.

In an embodiment of the method, the first semiconductor substrate is a cavity Silicon-on-Oxide (C-SOI) substrate. That is, C-SOI may be selected instead of SOI as substrate. This C-SOI can already provide some of the cavities mentioned above, thus simplifying the fabrication process.

In an embodiment of the method, the processing of the MEMS layer and the first contacts on the first semiconductor substrate, respectively, can be performed by CMOS compatible patterning techniques (e.g. lithography, dry etching).

In particular, this processing of the MEMS layer can be performed by fine lithography and dry etching, such that the MEMS structure is defined precisely as indicated on the lithography mask That is, the MEMS layer can be processed without using vapor HF or any other wet etching technique.

In an embodiment, the method further comprises, after the bonding: processing one or more vias through the first semiconductor substrate onto the second semiconductor substrate, wherein each via can be electrically connected in the second semiconductor substrate to one or more of the second contacts.

The one or more vias can thus each be High Aspect ratio (HAR) vias, which beneficially contributes to the miniaturization of the MEMS device.

In an embodiment, the method further comprises, after the bonding: Processing a sealing layer on the free surface of the first semiconductor substrate, in particular depositing an aluminum layer onto the free surface.

The sealing layer can also comprise any other material suitable for sealing. For example, any PVD or CVD material can be used to form the sealing layer. Thus, the method of the first aspect can result in a direct vacuum-sealed integration of the MEMS device.

In an embodiment, the method further comprises: processing one or more holes into the first semiconductor substrate, each hole connecting the free surface of the first semiconductor substrate with one of the cavities of the MEMS layer, processing the sealing layer in a vacuum or low-pressure environment, such that each hole is covered.

The one or more holes thus allow creating a vacuum or low-pressure environment in the cavities of the MEMS layer. This can be beneficial to the performance of the MEMS device.

In an embodiment of the method, the sealing layer, in particular the aluminum layer, forms one or more bondpads.

Thus, the sealing layer can beneficially be used on the one hand for the sealing, and on the other hand for applying different voltages to the MEMS layer.

In an embodiment of the method, each bondpad can be configured to contact one of the vias, cover one of the holes, or bias the free surface of the first semiconductor substrate.

The bondpads, further, have different functions, and can contribute to minimization of the MEMS device.

In an embodiment of the method, the MEMS layer includes an inertial sensor, e.g. a tuning fork gyroscope structure, in which the one or more movable structures include a proof mass and the one or more anchor structures include a sensing electrode.

A second aspect of the disclosure relates to a MEMS device obtained by the method according to the first aspect or any of its embodiments.

A third aspect of the disclosure provides a MEMS device, comprising a first semiconductor substrate comprising a MEMS layer including one or more movable structures and one or more anchor structures, one or more first contacts, each first contact being embedded into one of the anchor structures and being configured to bias that anchor structure. And this third aspect further comprises a second semiconductor substrate comprising a CMOS IC, and one or more second contacts electrically connected to the CMOS IC; wherein the first semiconductor part is bonded to the second semiconductor part, and wherein each first contact is in direct contact with one of the second contacts.

In an embodiment of the MEMS device, the first contacts are arranged on a bonding surface of the first semiconductor substrate, and the second contacts are arranged on a bonding surface of the second semiconductor substrate.

In an embodiment of the MEMS device, the first contacts are embedded into an oxide surface layer of the first semiconductor substrate.

In an embodiment of the MEMS device, the second contacts are embedded into a silicon carbide, silicon carbide nitride, silicon nitride, silicon oxynitride, or silicon oxide surface layer of the second semiconductor substrate.

In an embodiment, the MEMS device further comprises a plurality of cavities surrounding the anchor structures, wherein each movable structure is arranged in at least one of the cavities, and each first contact is arranged outside the cavities and/or inside the anchor structures.

In an embodiment of the MEMS device, the first semiconductor substrate is a cavity Silicon-on-Oxide (C-SOI) substrate.

In an embodiment of the MEMS device, the MEMS layer and the first contacts on the first semiconductor substrate are formed by CMOS compatible patterning techniques (e.g. lithography, dry etching).

In an embodiment, the MEMS device further comprises one or more vias extending through the first semiconductor substrate and onto the second semiconductor substrate, wherein each via is electrically connected in the second semiconductor substrate to one or more of the second contacts.

In an embodiment, the MEMS device further comprises a sealing layer on the free surface of the first semiconductor substrate, in particular the sealing layer is an Al layer.

In an embodiment, the MEMS device further comprises one or more holes in the first semiconductor substrate, each hole connecting the free surface of the first semiconductor substrate with one of the cavities of the MEMS layer, wherein the sealing layer covers each hole.

In an embodiment of the MEMS device, the sealing layer, in particular the Al layer, forms one or more bondpads.

In an embodiment of the MEMS device, each bondpad is respectively configured to contact one of the vias, cover one of the holes, or bias the free surface of the first semiconductor substrate.

In an embodiment of the MEMS device, the MEMS layer includes an inertial sensor, e.g. a tuning fork gyroscope structure, in which the one or more movable structures include a proof mass and the one or more anchor structures include a sensing electrode.

The MEMS devices of the second and third aspects and their embodiments achieve the same benefits as described above for the method of the first aspect and its respective embodiments.

In summary, the aspects and embodiments present a new method of fabricating a MEMS device without vapor HF etching. The method further enables zero level packaging, fusion bonding, a C-SOI approach, and high-vacuum sealing. The aspects and embodiment can realize an integrated zero level hermetic packaging MEMS device based on fusion bonding of moisture resistant materials. Further, the aspects and embodiments can allow Cu/dielectric bonding and electrical connections to individual parts of the MEMS device, particularly MEMS layer, to apply isolated voltages.

BRIEF DESCRIPTION OF THE DRAWINGS

The above described aspects and embodiments are explained in the following description of embodiments with respect to the enclosed drawings.

DETAILED DESCRIPTION OF EMBODIMENTS OF THE DISCLOSURE

Figure 1:
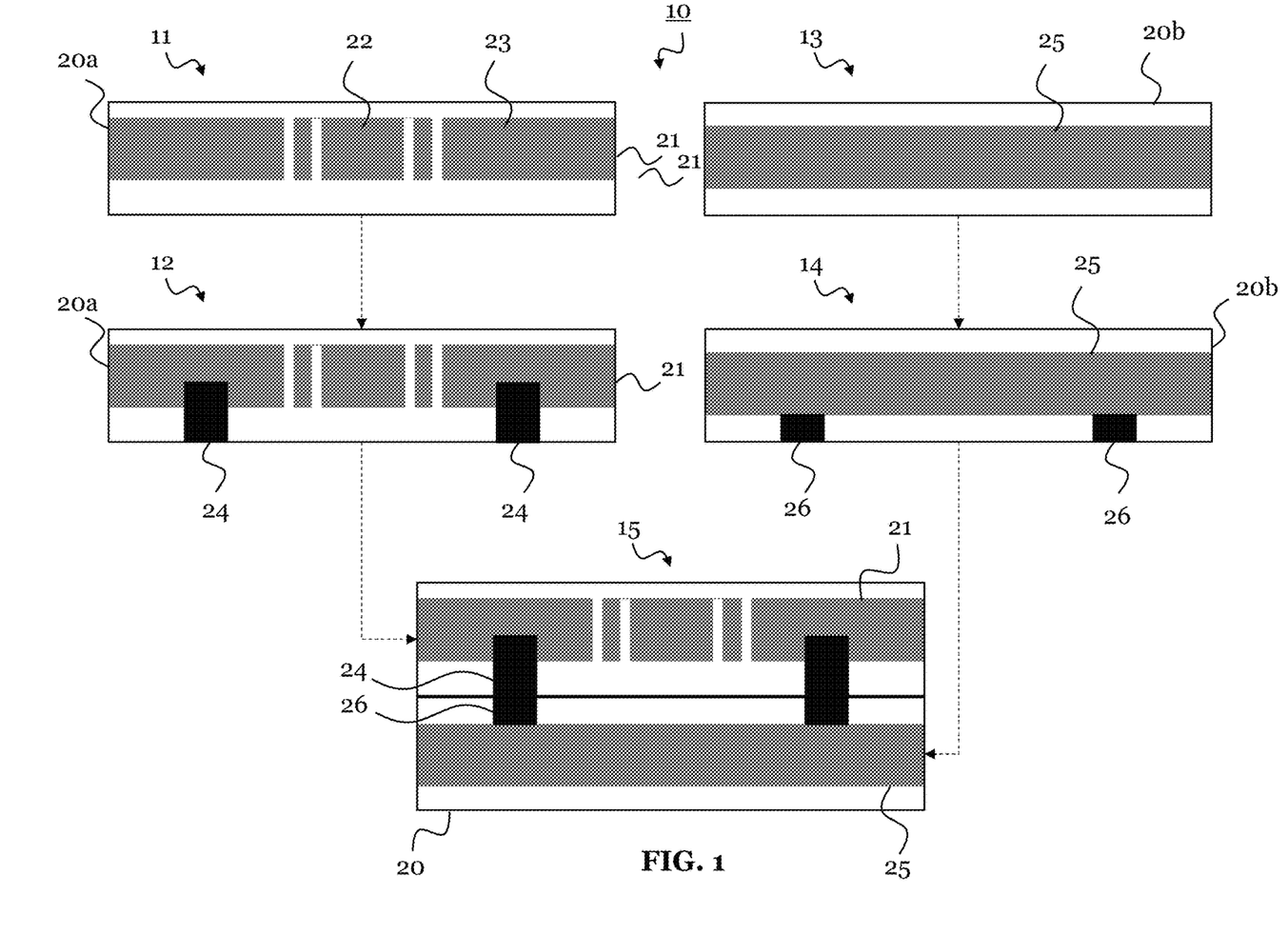
FIG. 1 shows a representative method 10, including steps 11-15, for fabricating a MEMS device according to an embodiment of the disclosure.

FIG. 1 shows a method 10, according to an embodiment of the disclosure, for fabricating a MEMS device 20. The method 10 can be carried out by CMOS compatible photo lithography and patterning (e.g. dry etching), and bonding, and particularly without vapor HF etching. The MEMS device 10 may be an inertial sensor, e.g. may be a tuning fork gyroscope device or may include a tuning fork gyroscope structure. However, the MEMS device may also be, or include, an accelerometer, resonator, inertial measurement unit (IMU) or the like.

The method 10 comprises a step 11 of processing a MEMS layer 21 on a first semiconductor substrate 20a. The MEMS layer 21 includes one or more movable structures 22, and includes one or more immovable anchor structures 23. Further, the method 10 comprises a step 12 of processing one or more first contacts 24 on the first semiconductor substrate 20a. Each first contact 24 can be processed into one of the anchor structures 23, and can be configured to bias that anchor structure 23. The steps 11 and 12 result in the first semiconductor substrate 20a ready for bonding.

The method 10 further comprises a step 13 of processing a CMOS IC 25 on a second semiconductor substrate 20b. Further, the method 10 comprises a step 14 of processing one or more second contacts 26 on the second semiconductor substrate 20b. Each second contact can be connected to the CMOS IC 25. The steps 13 and 14 can result in the second semiconductor substrate 20b ready for bonding.

Then, the method 10 comprises a step 15 of bonding the first semiconductor substrate 20a to the second semiconductor substrate 20b. In particular, the substrates 20a and 20b can be bonded such that each first contact 24 directly contacts one of the second contacts 26, i.e. aligned bonding.

Figure 2:
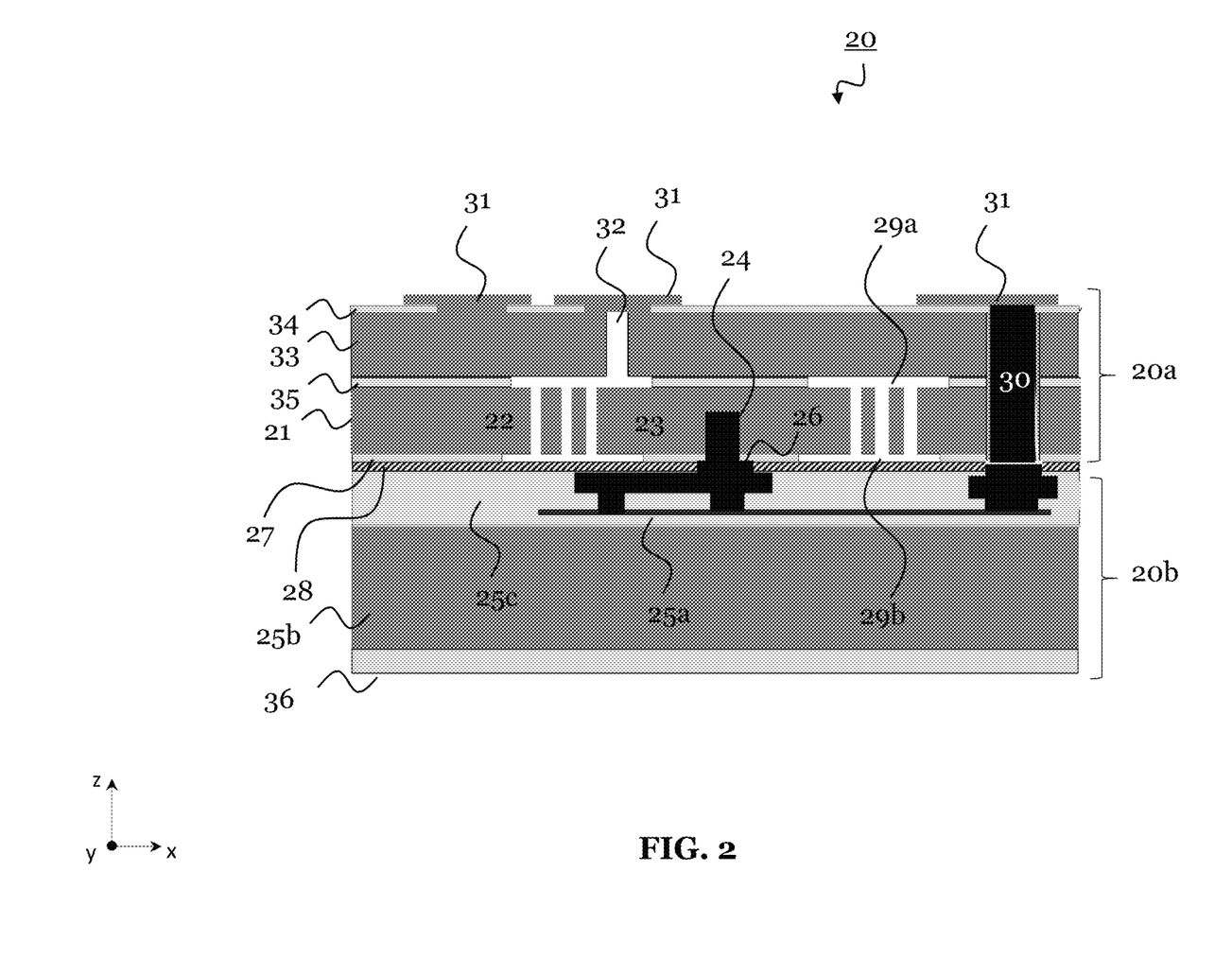
FIG. 2 shows a representative MEMS device according to an embodiment of the disclosure.

The steps 11-15 result in the MEMS device 20 according to an embodiment of the disclosure, as shown with respect to step 15 or in FIG. 2. The MEMS device 20 accordingly comprises the first semiconductor substrate 20a and the second semiconductor substrate 20b, which are bonded together.

The first semiconductor substrate 20a comprises the MEMS layer 21 including the one or more movable structures 22 and the one or more anchor structures 23; and comprises the one or more first contacts 24, wherein each first contact 24 can be embedded into one of the anchor structures 23, and can be configured to bias that anchor structure 23.

The second semiconductor substrate 20b comprises the CMOS IC 25 and one or more second contacts 26, which are electrically connected to the CMOS IC 25. Each second contact 26 can be in direct contact with one of the first contacts 26.

FIG. 2 shows a MEMS device 20 according to an embodiment of the disclosure. The MEMS device 20 of FIG. 2 builds on the MEMS device 20 shown in FIG. 1, which can be represented by the device at step 15, of FIG. 1. The MEMS device 20 of FIG. 2 shows more, optional device details. Accordingly, the MEMS device 20 of FIG. 2 includes all elements of the MEMS device 20 of FIG. 1. FIG. 2 is particularly a cross-sectional view of the MEMS device 20, showing its layers arranged in the z-direction, and showing its extension into the x-direction. The y-direction is into the x-z plane.

In particular, the MEMS device 20 may comprise a plurality of first cavities 29a and second cavities 29b that surround the anchor structures 23, i.e. each anchor structure 23 can be surrounded by at least one first cavity 29a and second cavity 29b. Each first cavity 29a may be formed between the MEMS layer 21 and a top layer 33 (e.g. a Si layer 33) of the first semiconductor substrate 20a. Adjacent to each first cavity 29a, an oxide layer 35 (e.g. a SiO₂ layer 35), may be arranged between the MEMS layer 21 and the top layer 33. Each second cavity 29b may be formed between the MEMS layer 21 and a bonding surface of the second semiconductor substrate 20b, in particular a silicon carbide, silicon carbide nitride, silicon nitride, silicon oxynitride or silicon oxide surface layer 28 of the second semiconductor substrate 20b. The first semiconductor substrate 20a may include an oxide surface layer 27 (e.g. a silicon dioxide layer 27), forming its bonding surface, and each second cavity 29b may be formed in this oxide surface layer 27. Each movable structure 22 may be arranged at least partly in at least one of the first and/or second cavities 29a, 29b. Each first contact 24 is arranged outside of the first and second cavities 29a, 29b and/or is arranged inside an anchor structure 23.

Further, the MEMS device 20 may comprise one or more vias 30 (only one is shown exemplarily in FIG. 2), which extend through the first semiconductor substrate 20a and land on the second semiconductor substrate 20b, e.g. on a dedicated contact. Each via 30 may be electrically connected in the second semiconductor substrate 20b to one or more of the second contacts 26, e.g. by metal lines or metal layers 25a formed in the second semiconductor substrate 20b. In particular, the semiconductor substrate 20b may comprise three metal layers 25a, wherein the metal layers 25a may be a part of the CMOS IC 25. The metal layers 25a may be formed in an oxide layer 25c (e.g. a silicon dioxide layer 25c). The oxide layer 25c may be provided on top of a bottom layer 25b (e.g. a silicon layer 25b). These layers 25c and 25b may belong to the CMOS IC 25. On the free surface of the second semiconductor substrate 20b, there may be an oxide layer 36 (e.g. a silicon dioxide layer 36), which is provided on the bottom layer 25b.

The MEMS device 20 may further comprise a sealing layer 31 on the free surface of the first semiconductor substrate 20a (i.e. on its top surface in FIG. 2), which may be formed on an oxide layer 34 (e.g. a silicon dioxide layer 34). The sealing layer 31 may be metal layer, e.g. an aluminum layer 31, or the like. The sealing layer 31, in particular the aluminum layer 31, may form one or more bondpads, i.e. the layer 31 may be patterned such that the bondpads are formed. Three bondpads are exemplarily shown in FIG. 2.

The MEMS device 20 may further comprise one or more holes 32 (only one hole is exemplarily shown in FIG. 2) in the first semiconductor substrate 20a. In particular, each hole 32 may be formed such that it connects the free surface of the first semiconductor substrate 20a with one of the first cavities 29a. That is, each hole 32 may be formed through the oxide surface layer 34 and through the top layer 33.

Notably, the sealing layer 31, or at least one of the bondpads formed by the sealing layer 31, may cover each hole 32. Each bondpad may particularly be configured to either contact one of the vias 30 (e.g. the right bondpad in FIG. 2), or cover one of the holes 32 (e.g. the left bondpad in FIG. 2), or bias the free surface of the first semiconductor substrate 20a (e.g. the middle bondpad in FIG. 2).

Figure 3:
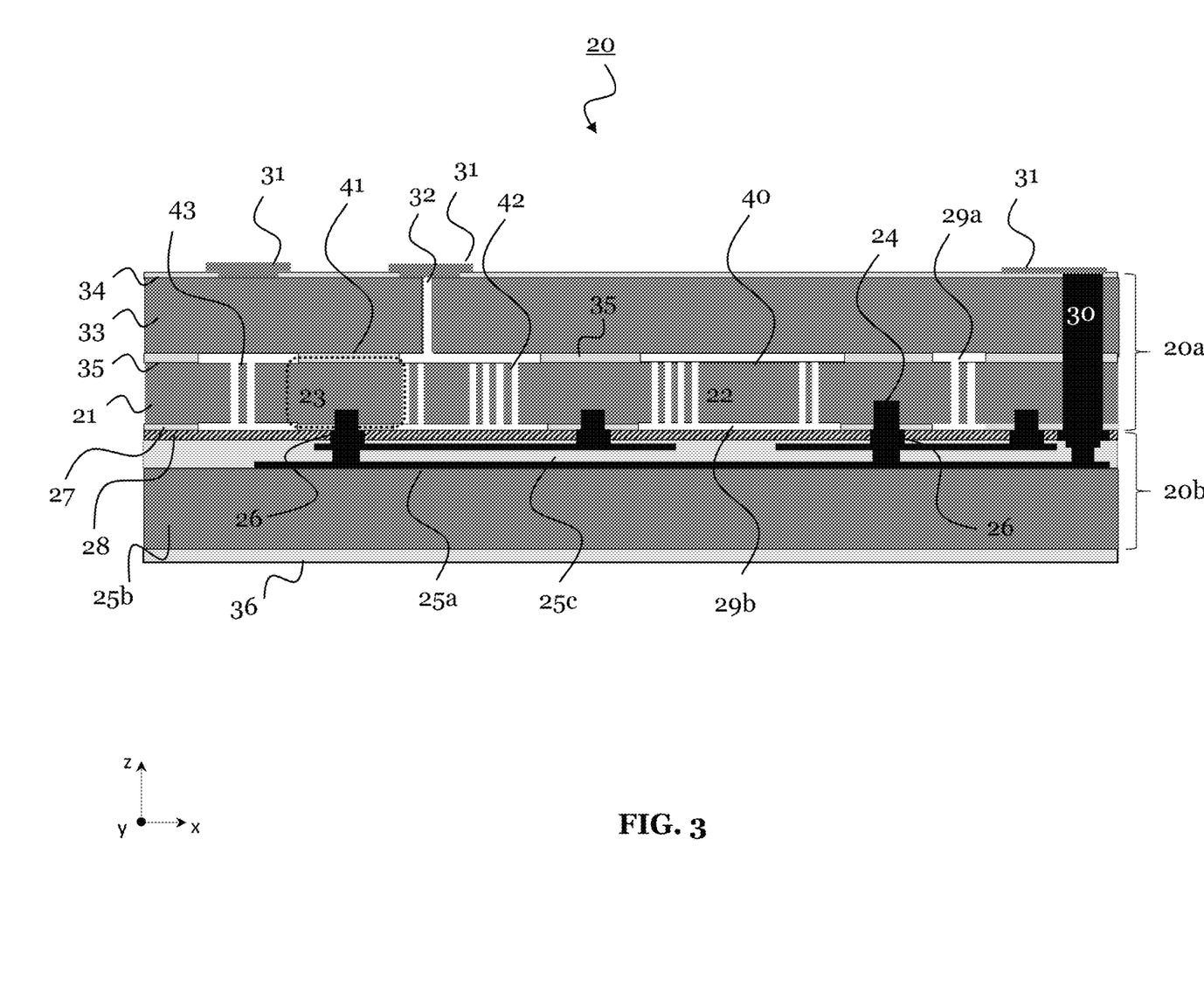
FIG. 3 shows a representative MEMS device according to an embodiment of the disclosure.

FIG. 3 shows a MEMS device 20 according to an embodiment of the disclosure. The MEMS device 20 shown in FIG. 3 builds on the MEMS device 20 shown in FIG. 1, (step 15), and MEMS device 20 in FIG. 2. The MEMS device 20 of a FIG. 3 shows more, optional device details. Accordingly, the MEMS device 20 of FIG. 3 includes all elements of the MEMS device 20 of FIG. 1, and may include the optional elements of the MEMS device 20 of FIG. 2. Elements labelled with same reference signs in different figures function likewise, and repeated description is omitted. FIG. 3 is a cross-sectional view of the MEMS device 20, showing its layers arranged in the z-direction, and showing its extension into the x-direction. The y-direction is into the x-z plane.

In particular, the MEMS device 20 may comprise a tuning fork gyroscope structure. Accordingly, in the MEMS device 20, the one or more movable structures 22 may include a proof mass 40, and the one or more anchor structures 23 may include (or be included in) a sensing electrode or sensing element 41. Further, the MEMS device 20 may comprise sensing beams 43. The MEMS device 20 may also comprise sensing and/or driving combs or fingers 42. In particular, the MEMS device 20 may comprise movable fingers 42 and/or may comprise immovable fingers 42.

Figure 4:
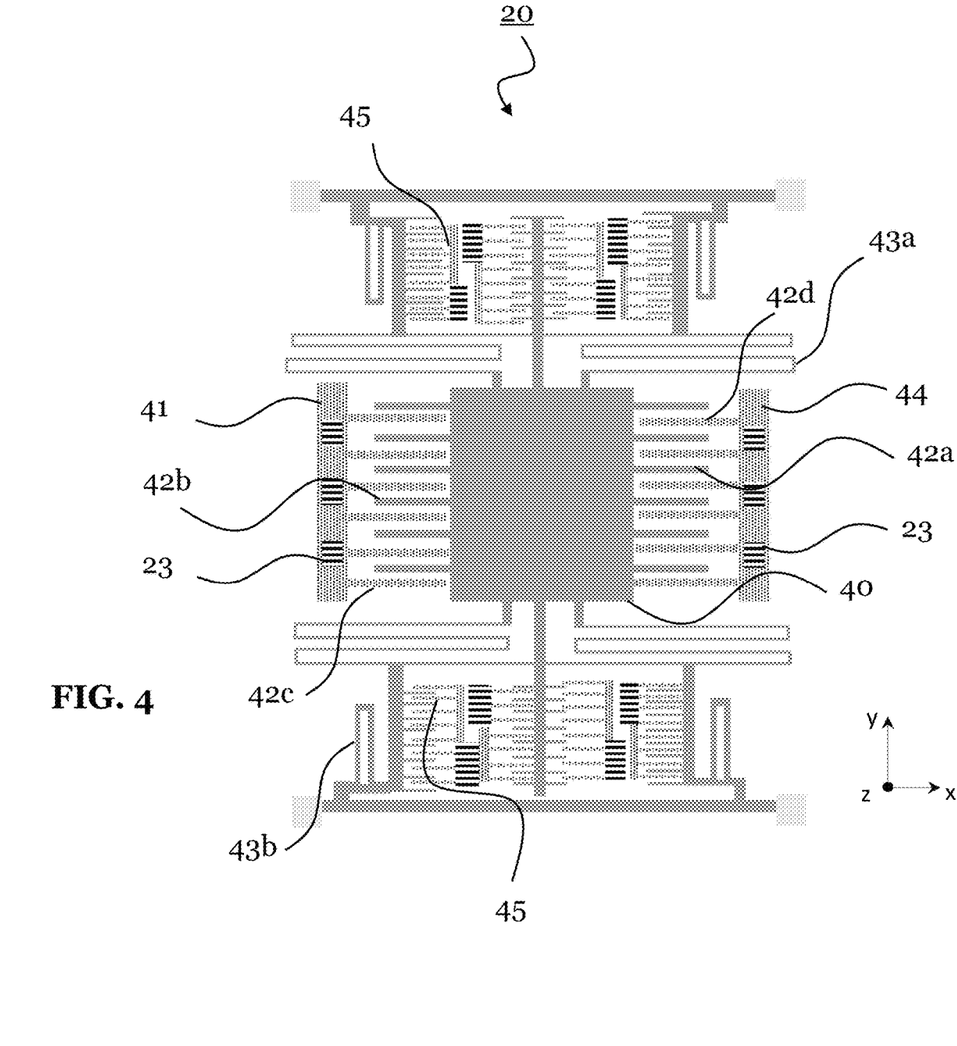
FIG. 4 shows a representative MEMS device (top view) according to an embodiment of the disclosure.

FIG. 4 shows a MEMS device 20 according to an embodiment of the disclosure. The MEMS device 20 of FIG. 4 builds on the MEMS device 20 shown in FIG. 1 (step 15), and on the MEMS device 20 of FIG. 3. The MEMS device 20 of a FIG. 4 shows more, optional device details. Accordingly, the MEMS device 20 of FIG. 4 includes all elements of the MEMS device 20 of FIG. 1, and may include the optional elements of the MEMS device 20 of FIG. 3. The MEMS device 20 of FIG. 4 comprises a tuning fork gyroscope structure. FIG. 4 is a top view of the MEMS device 20, showing its extension into y-direction, and showing its extension into the x-direction. The z-direction is into the x-y plane. FIG. 4 shows specifically the MEMS layer 21 of the MEMS device 20.

The MEMS device 20 of FIG. 4 comprises a proof mass 40, which may be connected with driving fingers 42a and sensing fingers 42b. Further, the MEMS device 20 may comprise anchor structures 23, which may comprise or be included in the sensing electrode 41. Other anchors 23 may comprise or be included in a driving electrode 44. The sensing electrode 41 may be connected with sensing fingers 42c, and the driving electrode 44 may be connected with driving fingers 42d. The sensing fingers 42 c are interleaved with the sensing fingers 42b, and the driving fingers 42d are interleaved with the driving fingers 42a. Each group of fingers 42a, 42b, 42c, and/or 42d may form a comb structure, wherein interleaved comb structures are formed. By means of the driving electrode 44 and driving fingers 42a and 42b, the proof mass 40 may be moved, particularly it may be vibrated. By means of the sensing electrode 41 and the sensing fingers 42a and 42b, the movement (vibration) or change of the movement may be sensed, particularly capacitively sensed.

The MEMS device 20 may further include sensing beams 43a and driving beams 43b. Further, the MEMS device 20 may include further driving electrodes 45.

Figure 5:
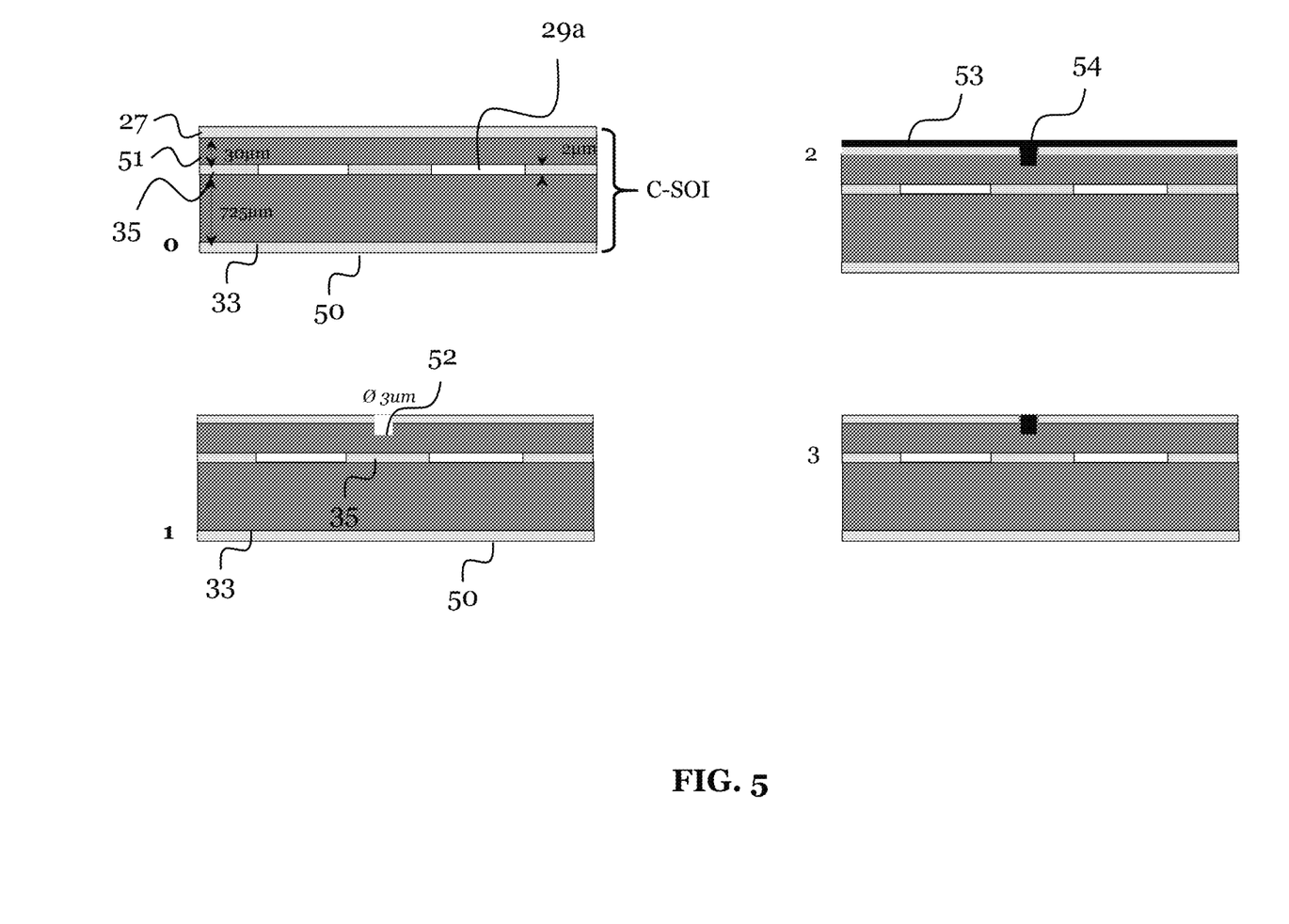
FIG. 5 shows steps 0 to 3 of a representative method for fabricating MEMS device according to embodiment of the disclosure, in particular steps of processing the first semiconductor substrate.
Figure 6:
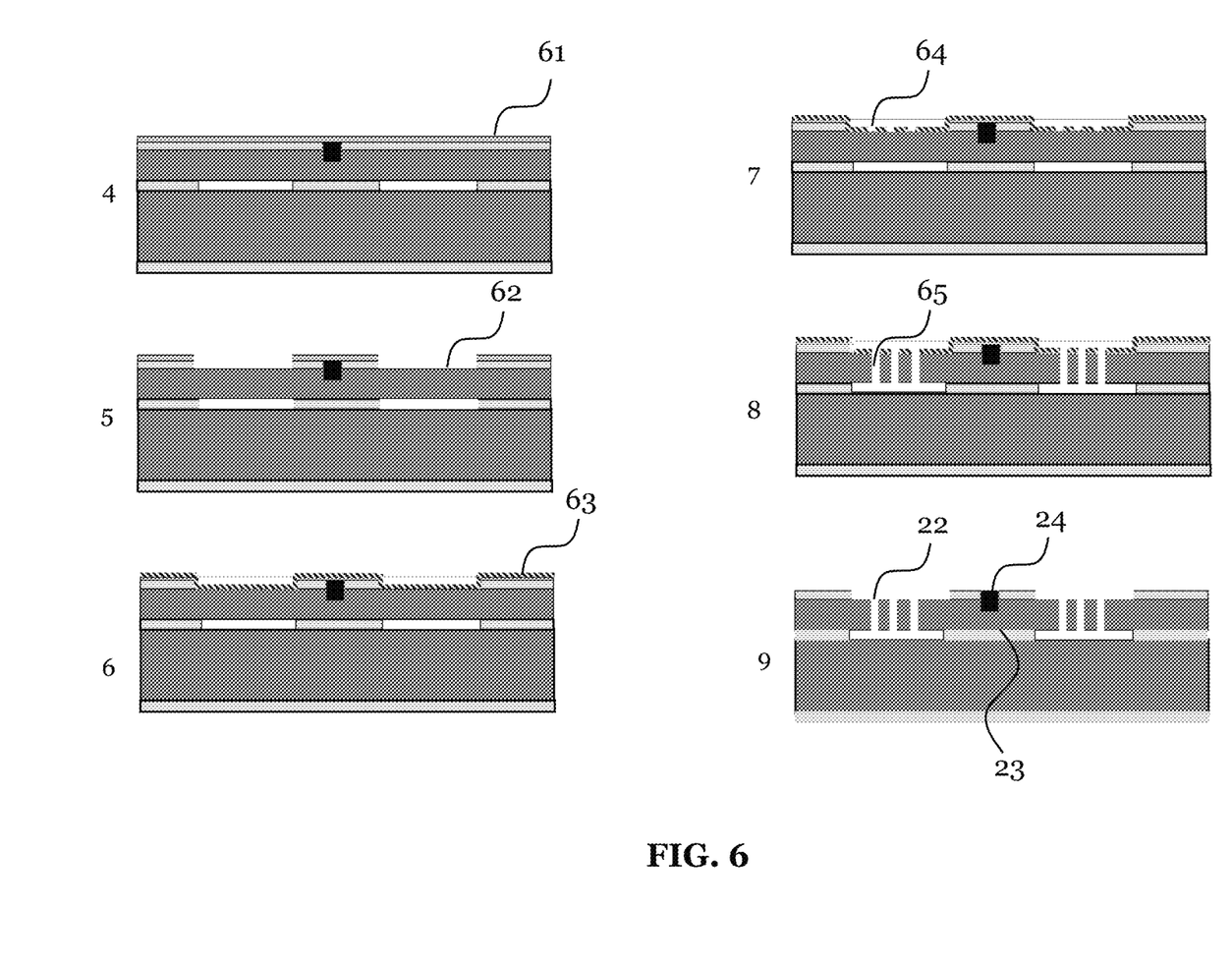
FIG. 6 shows steps 4 to 9 of a representative method for fabricating MEMS device according to embodiment of the disclosure, in particular steps of processing the first semiconductor substrate.

FIG. 5 and FIG. 6 show steps of the method 10, in particular steps to process the first semiconductor substrate 20a. The figures show sub-steps labelled with 0-9, and the sub-steps 0-9 are part of the steps 11 and 12 shown in FIG. 1.

In step 0, a C-SOI substrate may be selected or processed as a starting material for processing the first semiconductor substrate 20a. The C-SOI may include the first cavities 29a formed between a layer 51 (which will be processed into the MEMS layer 21) and the top layer 33. The first cavities 29a may in particular be formed within an oxide layer 35 arranged between these layers 33 and 51. The layer 51 may have a thickness of about 30 μm, the top layer 33 may have a thickness of about 725 μm, and the oxide layer 35 may have a thickness of about 2 μm. The C-SOI-substrate may also include the oxide surface layer 27 provided on the layer 51, and may include an oxide layer 50 on the top layer 33.

In step 1, a layer print followed by etching at least one hole 52 through the oxide layer 27 (e.g. 2 µm deep) and into the layer 51 (e.g. 1 µm deep into the layer 51, which can be a Si layer 51) may be performed. In particular, the hole 52 may be etched to have a diameter of 3 µm, or having dimensions of 3 µm×3 µm. Each hole 52 can define the size of a first contact 24 embedded into an anchor structure 23.

In step 2, a barrier layer 53 comprising e.g. tantalum/tantalum oxide/tantalum nitride may be formed on the oxide layer 27, and copper seed deposition followed by copper electroplating in the hole 52 and on the barrier layer 53 may be carried out.

In step 3, a Chemical Mechanical Polishing (CMP) step may be performed to remove the barrier layer 53 and the Cu disposed on it. A copper damascene process may also be performed.

In step 4, a layer 61 (e.g. an aluminum oxide layer 61) may be deposited on the oxide layer 27 and on the copper located in the hole 52. In particular, an atomic layer deposition may be performed to form the layer 61 on the oxide layer 27. The layer 61 can be robust and protects the copper in the further processing. Instead of copper, another metal may be used. For instance, nickel, tin, or a combination of copper and/or nickel and/or tin, may be used instead of copper, Plated materials can be used that can bond with eutectic or thermo-compression.

In step 5, a print followed by an etch 62 of the layer 61 and the oxide layer 27, respectively, can be carried out, in order to expose layer 51 and to define the location of the second cavities 29b.

In step 6, a PECVD layer 63 (e.g. a PECVD silicon dioxide layer 63) may be deposited onto the top surface (layer 61 or exposed layer 51) of the stack.

In step 7, an etch print 64 may be made on the PECVD layer 63 to continue with the PECVD layer 63 as a Hard Mask (HM).

In step 8, an etching 65 of the layer 51 may be performed, where it is exposed to form parts, in particular the movable structures, of the MEMS layer 21 in the layer 51. That is, the layer 51 becomes the MEMS layer 27. The etching may be performed with the PECVD layer 63 as HM, and may be performed such that it lands on the second cavities 29b.

In step 9, the remaining PECVD HM layer 63 may be removed (e.g. by dry plasma) and the layer 61 may also be removed (e.g. by wet etching). The first semiconductor substrate 20b is now ready for bonding.

Figure 7:
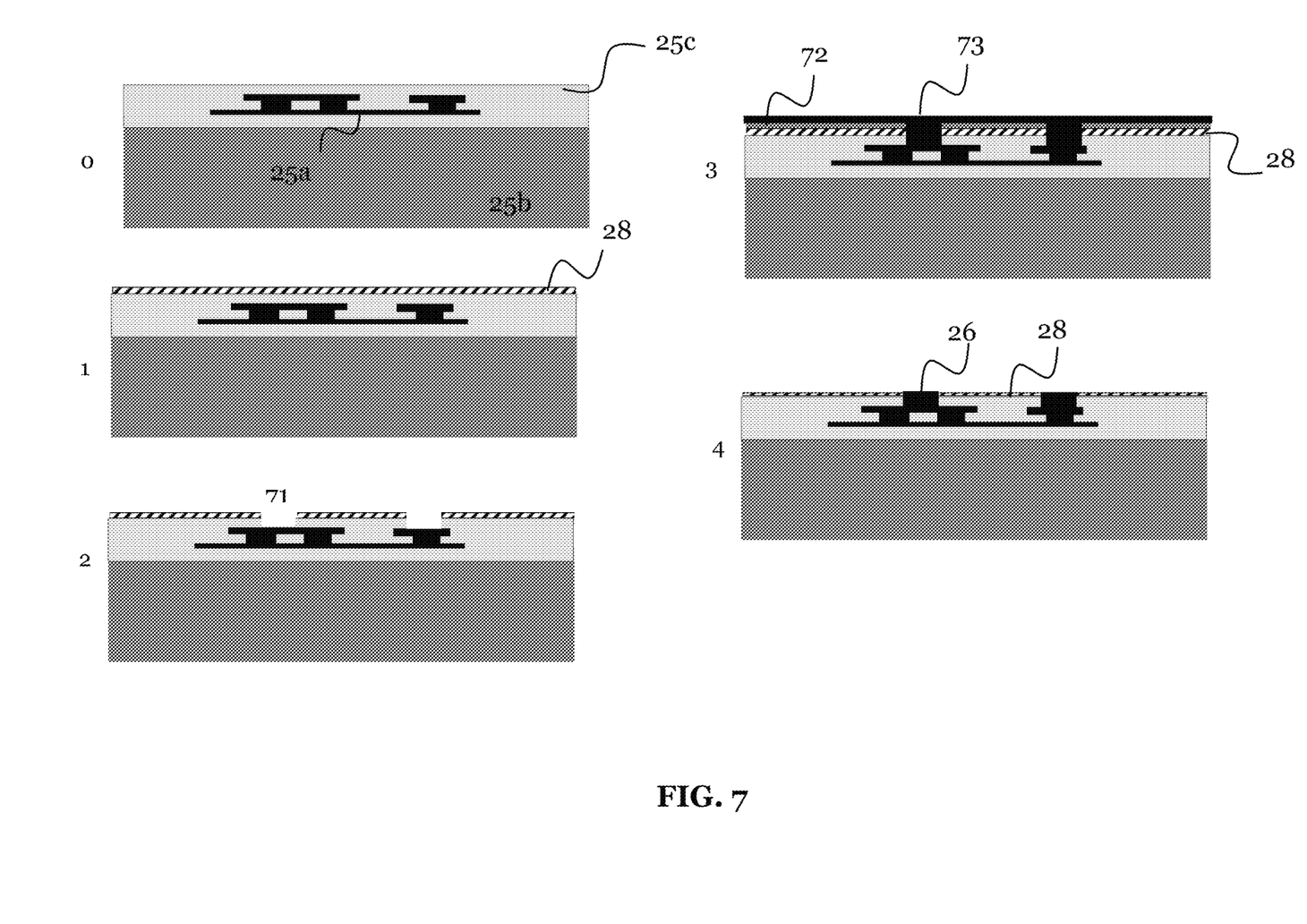
FIG. 7 shows steps 0 to 4 of a representative method for fabricating MEMS device according to embodiment of the disclosure, in particular steps of processing the second semiconductor substrate.

FIG. 7 shows steps of the method 10, in particular steps to process the second semiconductor substrate 20a. The figure shows sub-steps labelled with 0-4, and the sub-steps 0-4 are part of the steps 13 and 14 shown in FIG. 1.

In step 0, a CMOS substrate (or wafer) may be selected or processed as a starting material for processing the second semiconductor substrate 20b. The CMOS substrate may include the metal layers 25a (e.g. three metal layers 25a, e.g. made of copper), the bottom silicon layer 25b, and the oxide layer 25c, particularly it may include the CMOS IC 25.

In step 1, the silicon carbide, silicon carbide nitride, silicon nitride, silicon oxynitride, or silicon oxide layer 28 may be formed, in particular by deposition, on the oxide layer 25c.

In step 2, a print followed by etching of holes 71 into the dielectric stack (through layer 28 and oxide layer 25c) may be performed, such that the holes 71 land on the metal layer(s) 25a.

In step 3, a barrier layer 72 (e.g. tantalum/tantalum nitride) may be formed and copper seed deposition followed by copper electroplating may be carried out to form a copper layer 73 on the barrier layer 72, and copper in the holes 71. Instead of copper, another metal may be used.

In step 4, CMP may be performed to remove the barrier layer 72 and copper layer 73 on the top surface, so that copper remains in the holes 71 to form the second contacts 26. A copper damascene process may also be performed. The second semiconductor substrate 20b is now ready for bonding.

Figure 8:
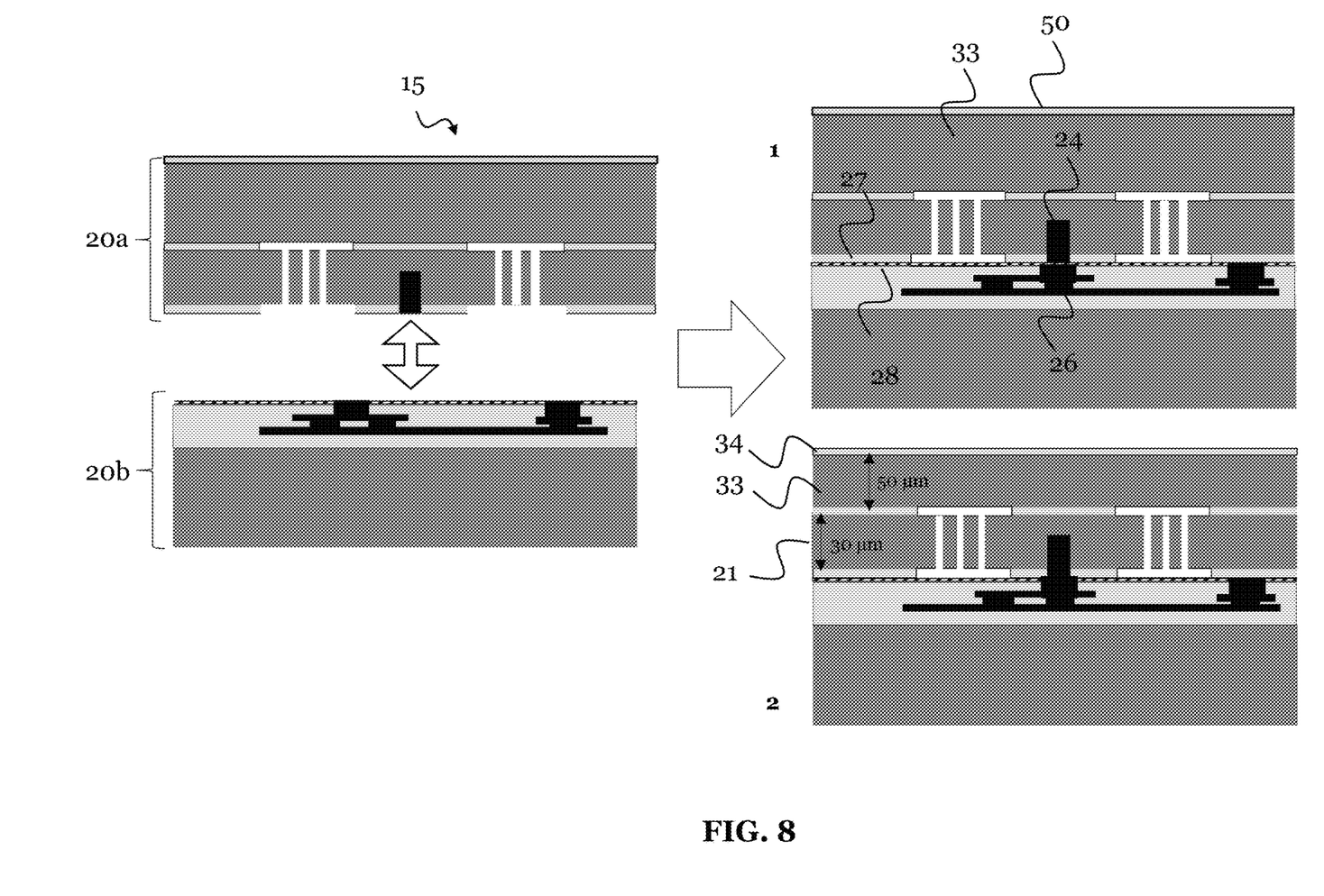
FIG. 8 shows steps 1 and 2 of a representative method for fabricating MEMS device according to embodiment of the disclosure, in particular steps of bonding the first semiconductor substrate to the second semiconductor substrate.
Figure 9:
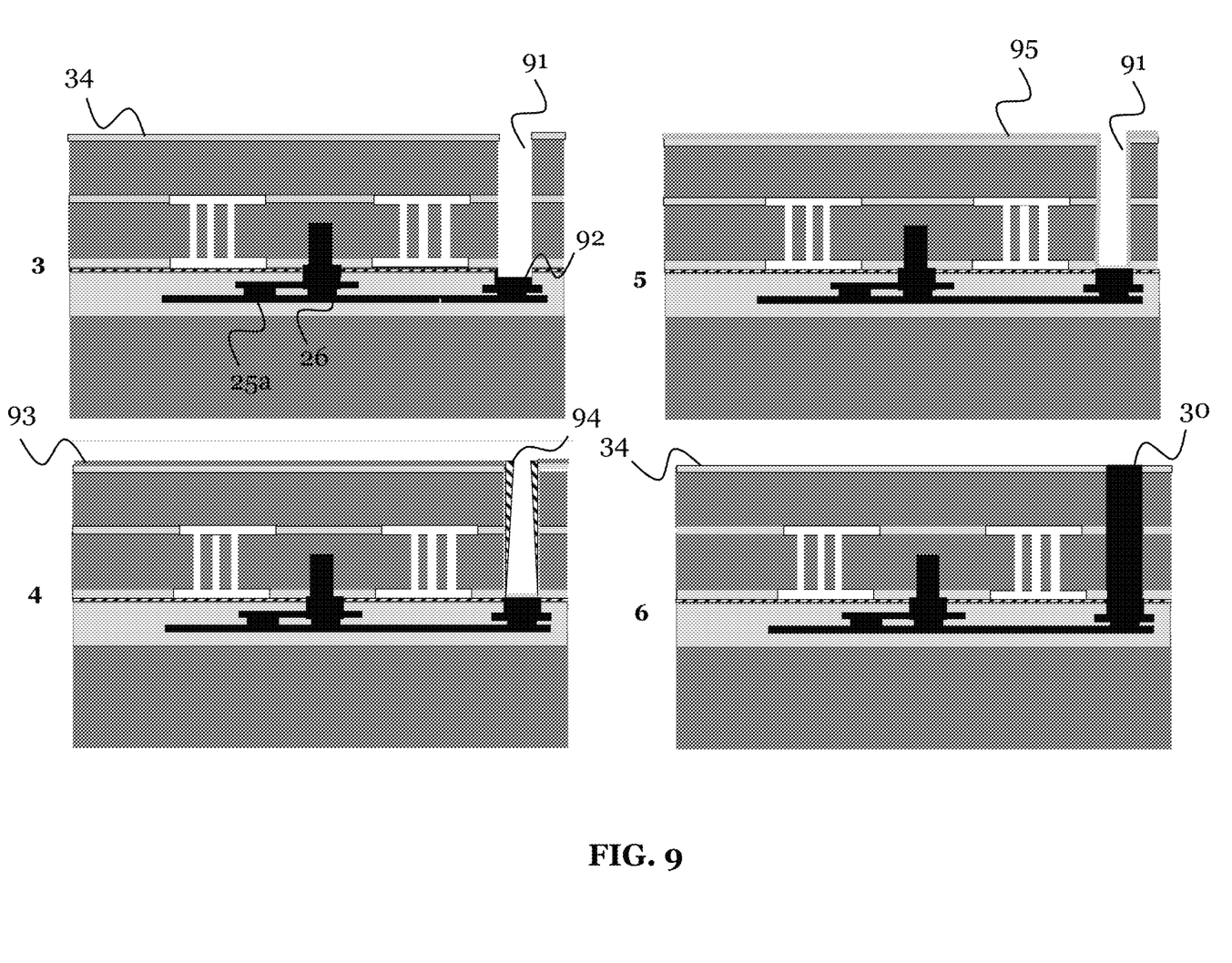
FIG. 9 shows steps 3 to 6 of a representative method for fabricating MEMS device according to embodiment of the disclosure, in particular steps after bonding the first semiconductor substrate to the second semiconductor substrate.
Figure 10:
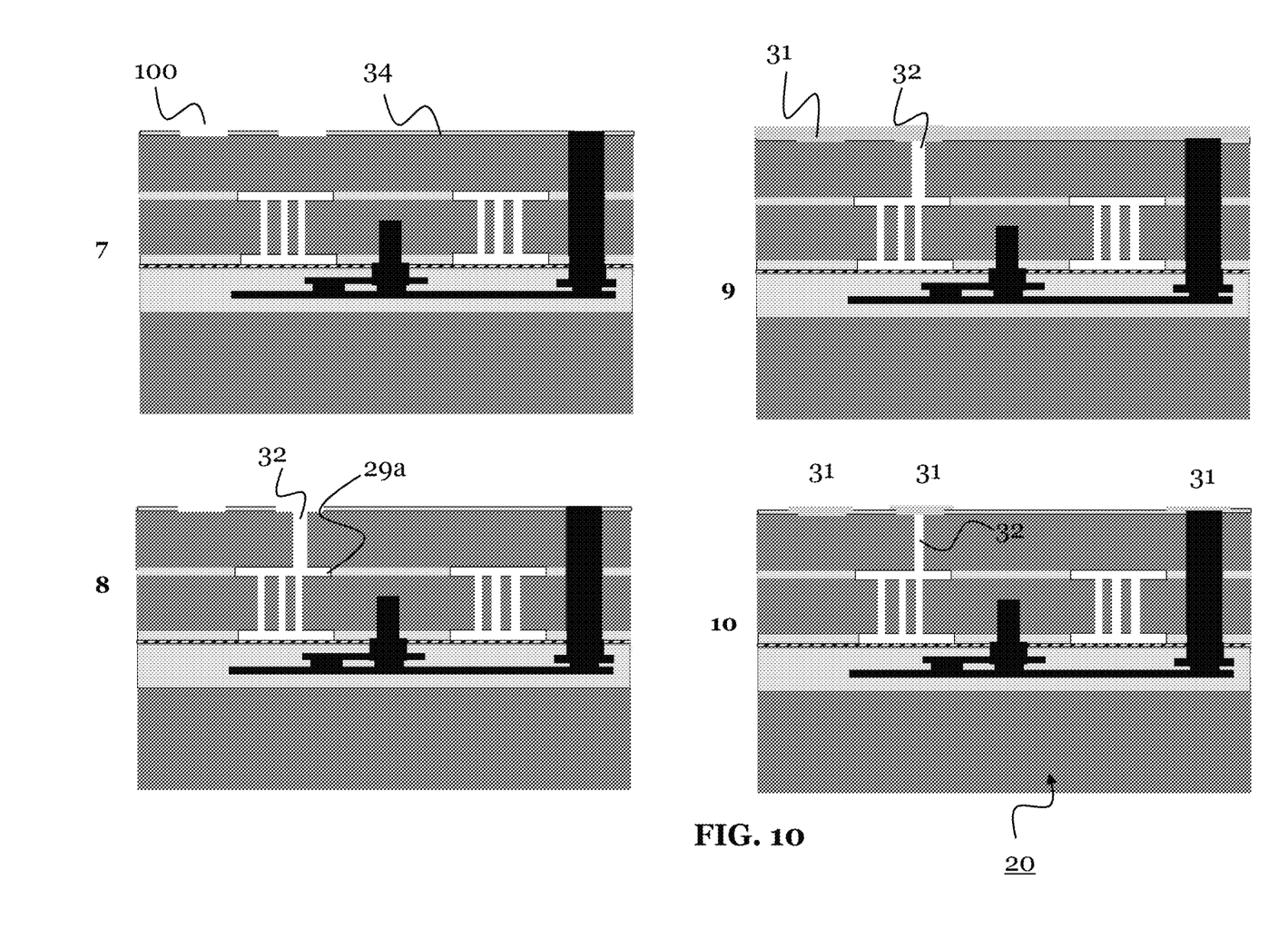
FIG. 10 shows steps 7 to 10 of a representative method for fabricating MEMS device according to embodiment of the disclosure, in particular steps after bonding the first semiconductor substrate to the second semiconductor substrate.

FIG. 8-10 show steps of the method 10, in particular the step 15 to bond the second semiconductor substrate 20a to the first semiconductor substrate 20b (FIG. 8 left side), and steps after the bonding. The figures show particularly sub-steps labelled with 1-10 performed after the bonding step 15. The sub-steps 1-10 may particularly be used to obtain the MEMS device 20 according to specifically FIG. 2 or FIG. 3.

In step 1, following the bonding step 15, e.g. performed by aligned fusion bonding, the bonded substrate pair 20a/20b is shown. The first contacts 24 land on the second contacts 26 in the bonding step 15: Else, the oxide layer 27 of the first semiconductor substrate 20a bonds to the surface layer 28 of the second semiconductor substrate 20b.

In step 2, the top layer 33 (including oxide layer 50) may be grinded down to a thickness of about 50 µm, and then the oxide layer 34 (e.g. silicon dioxide layer 34) may be deposited to form a HM. Notably, the MEMS layer 21 may have a thickness of about 30 µm.

Step 3 (FIG. 9) includes printing followed by etching a deep hole 91. The deep hole 91 may be etched through the first semiconductor substrate 20a and onto the second semiconductor substrate 20b. In particular, it lands on a contact 26 of the second semiconductor substrate 20b.

Step 4 provides a liner deposition 93 and a non-conformal deposition 94 (e.g. a non-conformal silicon nitride deposition), wherein the non-conformal deposition 94 may be disposed in the deep hole 91, particularly at the side surfaces of the deep hole 91.

In step 5, a directional oxide etch may be performed, followed by deposition of a layer 95 (e.g. tantalum layer 95) on the oxide layer 34 and in the deep hole 91, and providing a copper seed layer in the deep hole 91.

In step 6, copper plating and CMP of copper and the layer 95 may be performed to create via 30 in the deep hole 91, and the seed layer may be removed. Instead of copper, another metal may be used. For instance, nickel or tin or tungsten may be used instead of copper.

In step 7, a print and oxide etch 100 of the oxide layer 34 may be performed.

In step 8, a print and etch of one or more holes 32, each hole 32 etched in one of the previously made oxide etches 100, may be carried out. Each hole 32 connects the free surface of the stack to a first cavity 29a.

In step 9, the sealing layer 31, in particular aluminum layer 31, may be deposited onto the top of the stack including the oxide layer 34, and the oxide etches 100. In particular, the sealing layer 31 may be formed in a vacuum or low-pressure environment, e.g. in a Physical Vapor Deposition (PVD) chamber. The vacuum or low-pressure can thus also be created and sealed in the cavity 29a and 29b, to which the hole 32 connects.

In step 10, the sealing layer 31 may be formed into bondpads. In particular, by a print accompanied by a sealing layer 31 wet etch and resist strip. As shown, one bondpad may be configured to contact the via 30, one may be configured to cover the hole 32, and one may be configured to bias the free surface of the first semiconductor substrate 20a.

FIG. 10, step 10, shows the completed MEMS device 20, as shown in FIG. 2.

In summary, the above embodiments and variants present a fabrication method 10 for a MEMS device 20 and the corresponding MEMS device 20. The MEMS device 20 can be fabricated without using vapor HF etching. Furthermore, the MEMS device 20 can be provided with zero level packaging. In addition, the MEMS device 20 can precisely control the MEMS layer 21 by means of the CMOS IC 25.

The invention claimed is:

1. A method for fabricating a microelectromechanical systems (MEMS) device, wherein the method comprises:
   processing a MEMS layer on a first semiconductor substrate, the MEMS layer including one or more movable structures, one or more anchor structures, and a plurality of cavities surrounding the one or more anchor structures, wherein each movable structure is arranged in at least one of the cavities;
   processing one or more first contacts on the first semiconductor substrate, each first contact being processed into one of the anchor structures and being configured to bias that anchor structure;
   processing a Complementary Metal-Oxide-Semiconductor (CMOS) integrated circuit (IC) on a second semiconductor substrate;
   processing one or more second contacts on the second semiconductor substrate, each second contact being connected to the CMOS IC;
   bonding the first semiconductor substrate to the second semiconductor substrate to form a MEMS device such that each first contact directly contacts one of the second contacts;
   after bonding, processing one or more holes into a free surface of the first semiconductor substrate of the MEMS device, each hole connecting the free surface of the first semiconductor substrate with the one or more cavities of the MEMS layer; and
   processing a sealing layer on the free surface of the first semiconductor substrate of the MEMS device in a vacuum or low-pressure environment such that the one or more holes on the free surface is covered and the vacuum or low-pressure environment is created in the one or more cavities of the MEMS layer.

2. The method according to claim 1, wherein:
   the first contacts are processed to be arranged on a bonding surface of the first semiconductor substrate; and
   the second contacts are processed to be arranged on a bonding surface of the second semiconductor substrate.

3. The method according to claim 1, wherein:
   the first contacts are processed into an oxide surface layer of the first semiconductor substrate.

4. The method according to claim 1, wherein:
   the second contacts are processed into a silicon carbide, silicon nitride, silicon oxynitride, or silicon oxide surface layer of the second semiconductor substrate.

5. The method according to claim 1, wherein:
   the first semiconductor substrate is a cavity Silicon-on-Oxide (C-SOI) substrate.

6. The method according to claim 1, wherein:
   the processing of the MEMS layer and the first contacts on the first semiconductor substrate, respectively, is performed by CMOS compatible photo lithography and patterning.

7. The method according to claim 1, further comprising, after the bonding:
   processing one or more vias through the first semiconductor substrate onto the second semiconductor substrate,
   wherein each via is electrically connected in the second semiconductor substrate to one or more of the second contacts.

8. The method according to claim 1, wherein the sealing layer is an aluminum layer.

9. The method according to claim 1, wherein:
   the sealing layer forms one or more bondpads.

10. The method according to claim 9, wherein:
    the one or more bondpads is configured to contact a via through the first semiconductor substrate onto the second semiconductor substrate, wherein the via is electrically connected in the second semiconductor substrate to the one or more of the second contacts.

11. The method according to claim 9, wherein:
    the one or more bondpads is configured to cover each hole in the first semiconductor substrate.

12. The method according to claim 9, wherein:
    the one or more bondpads is configured to bias the free surface of the first semiconductor substrate.

13. The method according to claim 1, wherein:
    the MEMS layer includes an inertial sensor in which the one or more movable structures include a proof mass and the one or more anchor structures include a sensing electrode.

14. The method according to claim 13, wherein the inertial sensor is a tuning fork gyroscope structure.

* * * * *